(12) United States Patent
Zurek et al.

(10) Patent No.: US 11,916,522 B2
(45) Date of Patent: Feb. 27, 2024

(54) BROADBAND DIPLEXED OR MULTIPLEXED POWER AMPLIFIER

(71) Applicants: The Regents of the University of Colorado, a body corporate, Denver, CO (US); MASSACHUSETTS INSTITUTE OF TECHNOLOGY, Cambridge, MA (US)

(72) Inventors: Philip Zurek, Boulder, CO (US); Zorana Popovic, Boulder, CO (US)

(73) Assignees: The Regents of the University of Colorado, a body corporate, Denver, CO (US); Massachusetts Institute of Technology, Cambridge, MA (US)

( * ) Notice: Subject to any disclaimer, the term of this patent is extended or adjusted under 35 U.S.C. 154(b) by 155 days.

(21) Appl. No.: 17/326,283

(22) Filed: May 20, 2021

(65) Prior Publication Data

US 2021/0367568 A1 Nov. 25, 2021

Related U.S. Application Data

(60) Provisional application No. 63/190,744, filed on May 19, 2021, provisional application No. 63/027,889, filed on May 20, 2020.

(51) Int. Cl.
| | | |
|---|---|---|
| *H04B 7/155* | (2006.01) |
| *H03F 3/24* | (2006.01) |
| *H04L 5/14* | (2006.01) |
| *H04L 25/08* | (2006.01) |
| *H03F 1/56* | (2006.01) |

(52) U.S. Cl.
CPC ............... *H03F 3/245* (2013.01); *H03F 1/56* (2013.01); *H04L 5/1438* (2013.01); *H04L 25/08* (2013.01); *H03F 2200/165* (2013.01); *H03F 2200/171* (2013.01); *H03F 2200/451* (2013.01)

(58) Field of Classification Search
CPC ....... H04L 25/12; H04L 25/08; H04L 5/1438; H03F 1/56; H03F 3/245; H03F 2200/165; H03F 2200/171; H03F 2200/451; H03G 3/3042; H04B 1/0458; H04B 15/02; H04B 1/0057; H04B 1/50; H04W 84/12
USPC .......................................................... 370/297
See application file for complete search history.

(56) References Cited

U.S. PATENT DOCUMENTS 6,256,482 B1 * 7/2001 Raab ..................... H03F 1/0227
332/149
6,285,251 B1 * 9/2001 Dent ....................... H03G 3/004
330/127

(Continued)

*Primary Examiner* — Edan Orgad
*Assistant Examiner* — Vanneilian Lalchinthang
(74) *Attorney, Agent, or Firm* — COZEN O'CONNOR

(57) ABSTRACT

A wideband amplifier includes a first diplexer receiving broadband input signals and divides them by frequency into a low band input signal and a high band input signal. The amplifier has separate high band and low band amplifiers coupled to amplify the low and high band input signals, and a second diplexer coupled to combine outputs of the low and high band amplifiers to form a wideband output. A method of amplification of an input signal includes separating the input signal into high and low band signals, separately amplifying the high and low band signals, and combining amplified high and low band signals into an output signal.

22 Claims, 6 Drawing Sheets

(56) References Cited

U.S. PATENT DOCUMENTS

| | | | | |
|---|---|---|---|---|
| 8,963,642 | B2* | 2/2015 | Wilson | H03F 3/195 |
| | | | | 330/264 |
| 10,862,438 | B1* | 12/2020 | Blozinski | H04B 1/0475 |
| 10,873,336 | B2* | 12/2020 | Ali | H03M 1/002 |
| 2006/0285788 | A1* | 12/2006 | Meyer | G01D 5/35383 |
| | | | | 385/12 |
| 2007/0058753 | A1* | 3/2007 | Saavedra | H03D 3/26 |
| | | | | 375/376 |
| 2015/0255865 | A1* | 9/2015 | Nishimoto | H01P 5/12 |
| | | | | 343/853 |
| 2016/0112072 | A1* | 4/2016 | Bauder | H04B 1/005 |
| | | | | 370/297 |
| 2016/0182102 | A1* | 6/2016 | Wang | H04B 1/0475 |
| | | | | 375/296 |
| 2016/0226653 | A1* | 8/2016 | Bharadia | H04B 1/525 |
| 2016/0254828 | A1* | 9/2016 | Hayafuji | H04W 84/12 |
| | | | | 370/278 |
| 2017/0005385 | A1* | 1/2017 | Khlat | H04B 1/006 |
| 2019/0226880 | A1* | 7/2019 | Raman | G01D 18/008 |
| 2020/0028567 | A1* | 1/2020 | Ashworth | H04B 1/0057 |
| 2020/0389228 | A1* | 12/2020 | Ashworth | H04B 7/15578 |
| 2022/0029643 | A1* | 1/2022 | Oh | H03H 7/38 |

* cited by examiner

BROADBAND DIPLEXED OR MULTIPLEXED POWER AMPLIFIER

CLAIM TO PRIORITY

This document claims priority to U.S. Provisional Patent Application 63/027,889 filed 20 May 2020, and to U.S. Provisional Patent Application 63/190,744 filed 19 May 2021. The entire contents of the aforementioned provisional patent applications are incorporated herein by reference in their entirety.

GOVERNMENT SUPPORT

This invention was made with government support under grant number FA8721-05-C-0002 and/or FA8702-15-D-0001 awarded by the Assistant Secretary of Defense for Research and Engineering (ASDRE). The government has certain rights in the invention.

BACKGROUND

A diplexer is a frequency-selective device that separates a broadband signal into separate high-frequency signals and low-frequency signals, or which combines separate high-frequency signals and low-frequency signals into a broadband signal.

There are radar and communications applications where it is desirable to amplify signals over a very broad range of frequencies.

A prior method of amplifying signals in frequency-hopping radars or communications systems uses a bank of narrowband power amplifiers (PAs), each designed for a different frequency range, connected through a network of switches. The disadvantage of these PAs is that they do not support inter-band carrier aggregation for communications because only one of the narrowband PAs is active at any instant of time.

To overcome the narrow instantaneous bandwidth, a single-ended broadband power amplifier (PA) can be designed. Octave, over two octaves, or decade (with distributed topology) bandwidth Pas have been demonstrated. More complicated topologies with multiple amplifiers include the load-modulated balanced amplifier (LMBA) with octave bandwidth and high efficiency. However, linearity of concurrent signals becomes a concern as signal mixing and harmonic generation occurs within the active nonlinear device—mixing of concurrent signals may result in intermodulation products at sum and difference frequencies of signals and signal harmonics.

Linearization techniques using two-dimensional digital pre-distortion (DPD) algorithms have been developed to compensate for signal mixing. This is applied in dual-band and broadband PAs and trades complexity in the RF domain for complexity in baseband.

SUMMARY

In an embodiment, a wideband amplifier includes a first diplexer receiving broadband input signals and divides them by frequency into a low band input signal and a high band input signal. The amplifier has separate high band and low band amplifiers coupled to amplify the low and high band input signals, and a second diplexer coupled to combine outputs of the low and high band amplifiers to form a wideband output.

In another embodiment, a method of amplification of an input signal includes separating the input signal into high and low band signals, separately amplifying the high and low band signals, and combining amplified high and low band signals into an output signal.

DETAILED DESCRIPTION OF THE EMBODIMENTS

Linear amplification of multiple signals present within a broad RF bandwidth finds many uses in radar, and communication, applications. Two key challenges exist when amplifying such signals:
(1) achieving broadband amplification with high power-added efficiency (PAE); and
(2) maintaining linearity for multiple, simultaneous (concurrent), signals.

Figure 1:
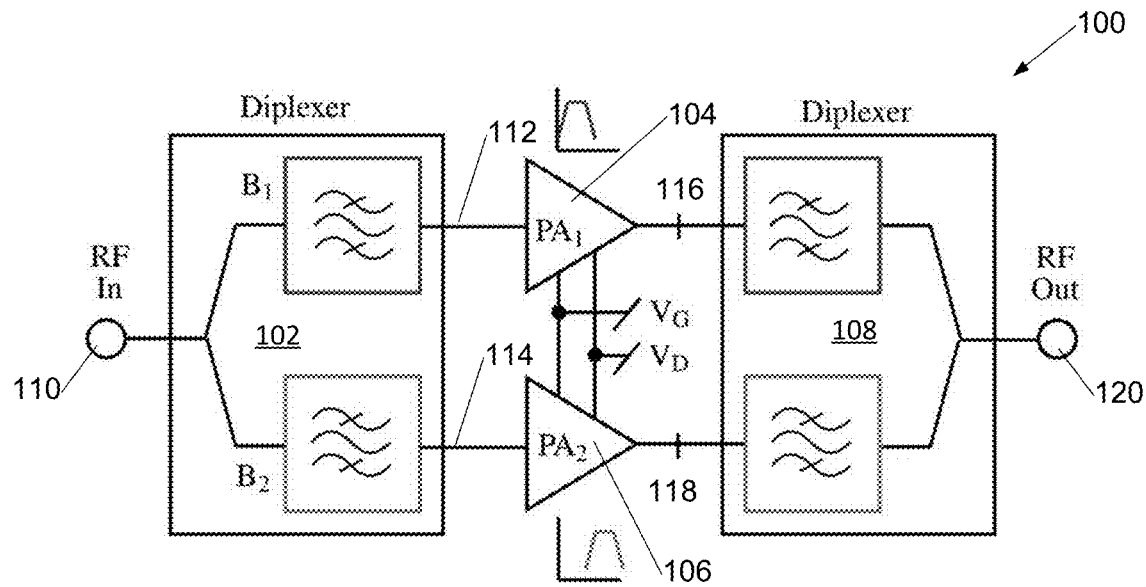
FIG. 1 is a block diagram of a broadband amplifier that includes a first diplexer to separate an input signal into high and low band input signals, narrower-band amplifiers coupled to amplify the high and low band input signals, and a second diplexer adapted to combine amplified high and low band signals into a broadband output signal.

We address these challenges with the approach illustrated by FIG. 1. A broadband power amplifier 100 is assembled from an input diplexer 102, a low-band power amplifier (PA) 104, a high-band PA 106, and an output diplexer 108. Broadband RF input signals 110 are separated by the input diplexer 102 into low-band signals 112 input to the low-band PA 104, and high-band signals 114 input to the high-band PA 106. Low-band PA 104 output 116 and high-band PA output 118 are input to the output diplexer 108, where they are combined to provide a broadband output 120 of the broadband power amplifier 100.

Figure 5A:
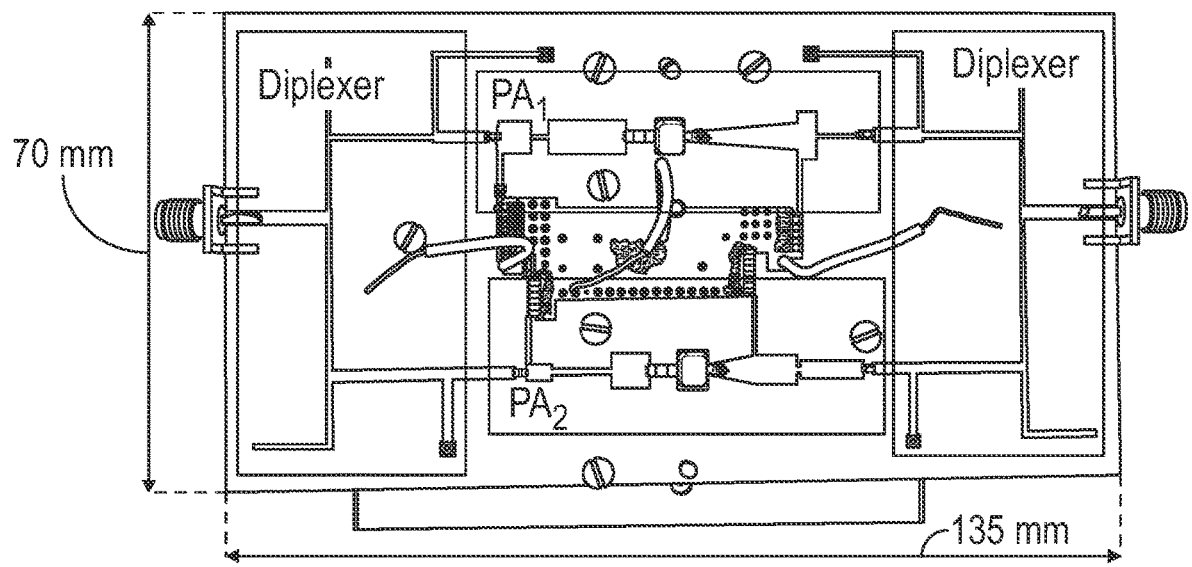
FIG. 5A is a photograph of a prototype amplifier in an embodiment.
Figure 5B:
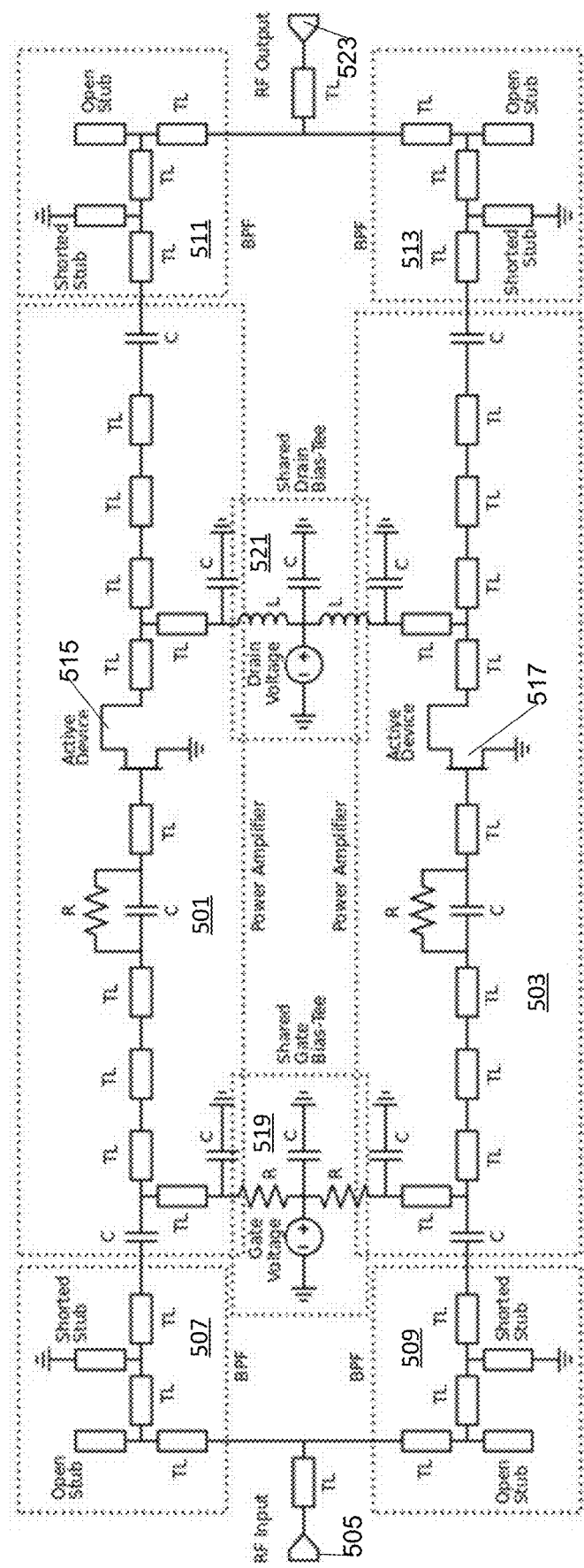
FIG. 5B is an electrical schematic diagram of the prototype amplifier of FIG. 5A.

In the approach illustrated by FIG. 1, and the prototype amplifier illustrated in FIGS. 5A and 5B, the diplexer includes only passive components such as resistors, capacitors, and transmission lines; the active components are, however, used in the low-band and high-band PAs.

Connecting two relatively narrowband frequency-offset PAs with correspondingly designed diplexers as in FIG. 1, has benefit of providing amplification with little mixing between concurrent high and low band signals because improved linearity for signals arises from isolation and harmonic rejection introduced by the diplexers 102, 108. Analog or digital pre-distortion (DPD) can still be used to further improve linearity, reduce mixing, and thereby reduce intermodulation products.

Figure 2:
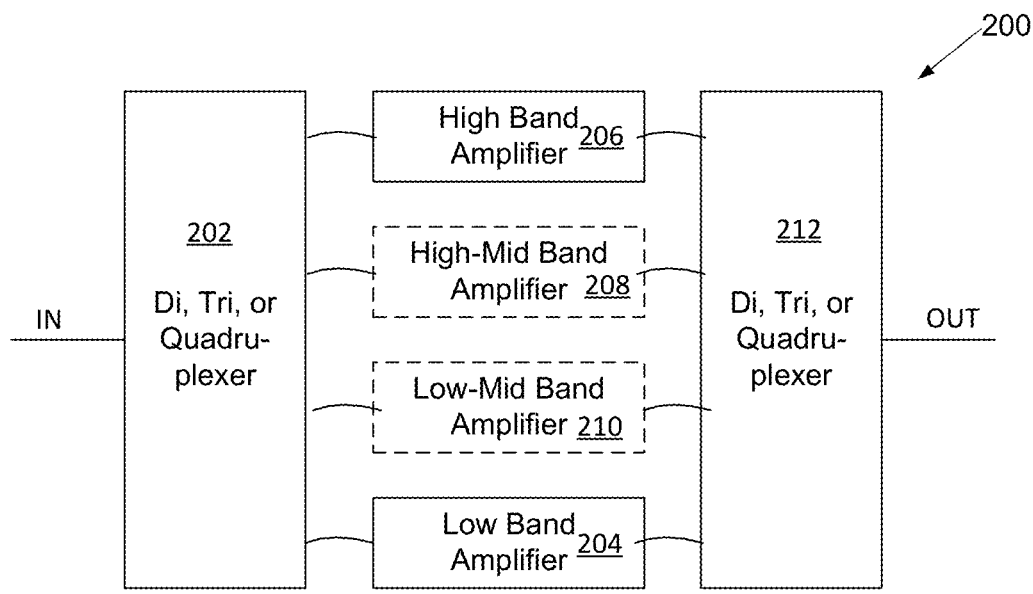
FIG. 2 is a block diagram illustrating a broadband amplifier constructed of more than two narrower-band amplifiers.

A broadband amplifier 200 (FIG. 2) may also be constructed of more than two narrower-band amplifiers. In this embodiment, input signals may be fed to a triplexer or quadriplexer, or higher-level multiplexer 202 where they are separated into low, high, and one, two, or more intermediate-band amplifier-input signals. Separate relatively narrow-band amplifiers, such as low band amplifier 204, high band amplifier 206, high-mid band amplifier 208, and low-mid band amplifier 210, amplify these amplifier-input signals to provide narrowband amplifier-output signals that are recombined in an additional triplexer or quadriplexer, or higher-level multiplexer 212 to give an output of broadband amplifier 200.

Mid-band signals in the transition band of frequencies where high-band and low-band filter passbands of diplexer filters meet are divided and amplified by both the high-band PA 106 and the low-band PA 104. For these mid-band frequencies in the transition band, in some embodiments the diplexers divide power evenly between the high-band and low-band PAs. In these embodiments, it is desirable that multiplexer filters, and in particular mid-band multiplexer filters, be band-pass filters to avoid excess power dissipation that may be induced in one PA by signals of frequencies intended to be amplified by another PA of the multiple PAs of the broadband amplifier.

II. Bode-Fano Criterion Limitations

This section describes fundamental matching limitations for a broadband PA. The Bode-Fano criterion is applied to sub bands and to the entire frequency range, with and without the bias networks of a PA.

Figure 3A:
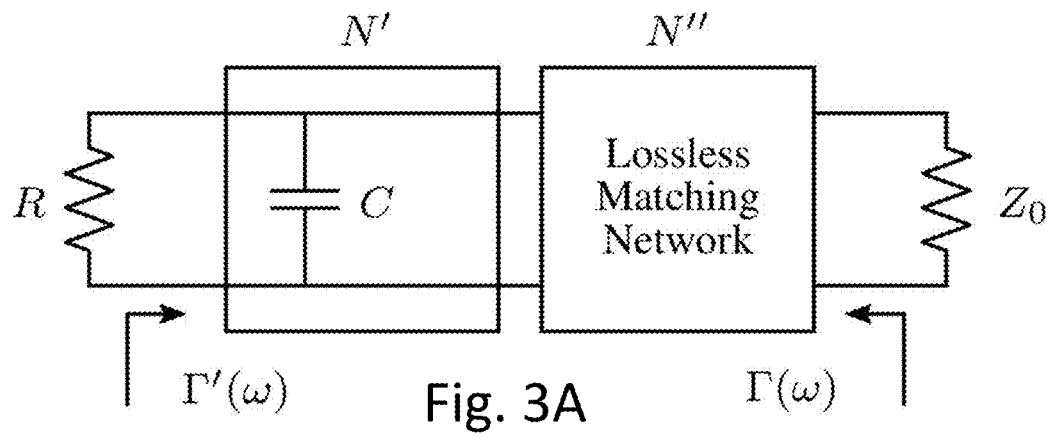
FIG. 3A is a schematic diagram illustrating impedance matching networks.

A lossless two-port matching network N" connected to a parallel RC load presents a reflection coefficient $\Gamma(\omega)$, shown in FIG. 3A. Bode showed that $\Gamma(\omega)$ is constrained by:

$$\int_0^\infty \ln\frac{1}{|\Gamma(\omega)|} d\omega < \frac{\pi}{RC} \quad \text{(Eqn. 1)}$$

Assuming a brick-wall response as the optimal $F(\omega)$ function, the minimum upper-bound on $|\Gamma(\omega)|=\Gamma_{min}$ can be described as:

$$\ln \Gamma_{min} = -\frac{1}{RC}\frac{\pi}{b\omega_0}, \quad \text{(Eqn. 2)}$$

with fractional bandwidth b and center angular frequency wo. Because R, C, b, and wo must be positive, $\Gamma_{min}$ and b are bounded between [0, 1] and [0, ∞] respectively.

Fano extended this work by considering a more general load. For the parallel RC load example, one can consider the reactive component (shunt C), as one network N', which can consist of many reactive elements. This network is connected to the resistive component of the load (shunt R), and the lossless matching network N". The N" network is connected to another resistive load, typically having impedance $Z_0=50'\Omega$, and it can be shown that the value of $Z_0$ does not affect the quality or bandwidth of $\Gamma'(\omega)$ in FIG. 3A. $\Gamma'(\omega)$ can be used in Equation 1 instead of $\Gamma(\omega)$ which has implications for PA design. This conclusion is commonly referred to as the Bode-Fano criterion.

Equation (1) results in a conjugate match for $\Gamma'(\omega)$ However, in PA design, large-signal impedances such as those obtained from load-pull are not conjugately-matched. Furthermore, quality of match $\Gamma'(\omega)$ becomes dependent on the spacings of the load-pull contours. We determine optimal conjugate load-pull impedances within the bandwidth of interest (impedance trajectory) and approximate it with a one or two-element N' network to apply equation 1. For more general conclusions, such as modelling parasitics, one could represent the impedance trajectory as an arbitrary load. This is valid only if the load is physically realizable as R and N', with N' containing only reactive elements.

As an example, consider the 7 W Qorvo T2G-6000528-Q3 transistor in a hybrid PA, with series source impedance $R=0.8'\Omega$ and L=0.17 nH, between 1.8 and 4 GHz. For the physically realizable arbitrary load (5-element N') describing the impedance trajectory, Kerr's approach is used to evaluate equation 1. However, the resulting system of non-linear polynomial equations does not seem to have a solution in all cases. This suggests that the Bode-Fano criterion cannot always be used to describe an arbitrary load and limits N' to two reactive elements, as Fano suggested.

Figure 3B:
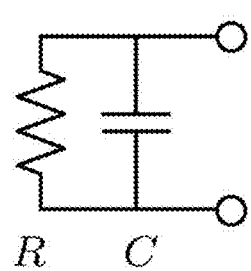
FIG. 3B represents a model of impedances of the transistor and FIG. 3C represents a model of impedance of a combination of the transistor and bias network.
Figure 3C:
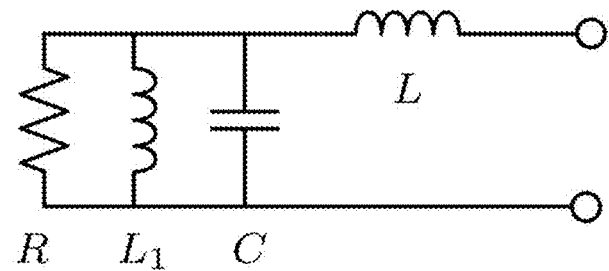
Figure 4A:
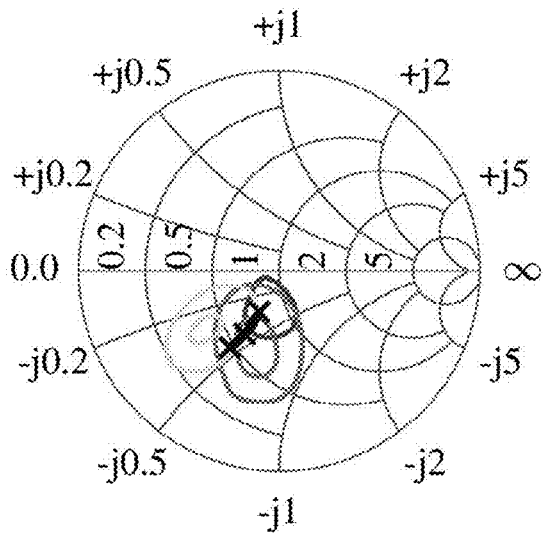
FIG. 4A represents power added efficiency (PAE) contours of the transistor without bias network.
Figure 4B:
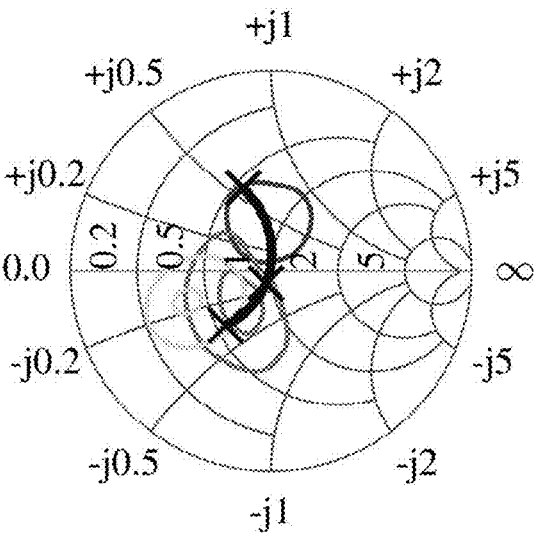
FIG. 4B represents PAE contours of the transistor with a bias network necessary to use the transistor in a power amplifier.

As a compromise, the impedance trajectory of the device output can be approximately described with a parallel R=45Ω and C=0.85 pF network (which includes packaging parasitics), corresponding to $\Gamma_{min}=-52$ dB and $\Gamma_{min}$ shown in FIG. 3B. Once realistic bias-tees and stability networks are added, source and load-pull simulations confirm that performance remains similar. The updated impedance trajectory can now be described by the inductively tuned low-pass structure consisting of a parallel R=50'Ω, L1=2.7 nH, and C=1.3 pF, connected to a series L=0.3 nH, as shown in FIG. 3C. The impedance trajectories and the conjugate load-pull impedances are shown in FIG. 4A and FIG. 4B. The fitted line for the RC and RLC loads from FIG. 3B and FIG. 3C overlaps with PAE contours, but the overlap degrades when the bias-tee is added, as illustrated in FIG. 4B.

In the non-degenerate case of FIG. 3C (when the first element of N" is not a series inductance), an improved $\Gamma_{min}=-123$ dB results. In the degenerate case when the first element is a series inductance, a degraded $\Gamma_{min}=-30$ dB results. In PA applications, the degenerate case is typically used, as other options either prevent dc bias (series C or shunt L) or limit higher-frequency performance (shunt C).

TABLE I

SUMMARY OF $\Gamma_{min}$ WITH AND WITHOUT BIAS-TEES

| Freq. (GHz) | No Tee [dB] | Tee [dB] | Tee (degen) [dB] |
|---|---|---|---|
| 1.8-4 | −52 | −123 | −30 |
| 1.8-2.8 | −104 | −276 | −67 |
| 3-4 | −121 | −289 | −107 |

Results for the 1.8-4 GHz band, and two smaller sub bands, are summarized in Table I, for the transistor without and with a bias-tee, and with a bias-tee network connected directly to a degenerate series inductance. To overcome the $\Gamma_{min}$ limitation, one can sacrifice bandwidth to improve the performance of a PA, as the improved sub band $\Gamma_{min}$ of Table I demonstrates. This leads to a broadband PA architecture where two narrowband (~30-40% fractional bandwidth) PAs, with offset center frequencies, are combined at the input and output with diplexers, as described next.

III. Diplexing Approach

We described combining two relatively narrowband PAs to maintain a wide bandwidth, as shown in FIG. 1. This work describes the diplexing approach introduced in detail through
(1) filter design;
(2) individual PA design; and
(3) integration.

Typically, this process is iterative, as each component affects the others.

A. Filter Design

Three distinct frequency regions are considered in the diplexer design: the lower, transition, and upper bands.

Considering the filter design, a diplexer is required with minimal insertion loss in the lower and upper bands, along with maintaining low combining loss and good input impedance match throughout the transition band. The combining loss can be described by:

$$IL = -10\log\frac{|S_{12} + S_{13}|^2}{2}. \quad \text{(Eqn. 3)}$$

The diplexer with the above characteristics is referred to as a "branching" or "invulnerable" filter and can be designed with two bandpass filters (BPFs), one high-frequency passband and one lower-frequency passband, that have the same three-decibel (dB) cutoff frequencies. Diplexer design is also influenced by PA and signal considerations. For example, if only one band is used, to prevent leakage RF power from turning on the transistor in the other branch, and thus creating undesired current draw and reducing efficiency, nulls are introduced in the out-of-band response of each branch of the diplexer.

In alternative embodiments, diplexers are designed with a low-pass filter (LPF) and a high-pass filter (HPF) and without band-pass filters; in a particular embodiment the low-pass filter has the same three-decibel (dB) cutoff frequency as the high-pass filter.

In amplifiers based on both dual BPF and LPF-HPF diplexers, the input diplexer separates incoming signals into low and high frequency ranges, the low frequencies are amplified by a low range PA, and the high frequencies are amplified by a high range PA, and outputs of the low range PA and the high range PA are combined by the output diplexer.

Two single-ended Butterworth BPF were designed for the lower and upper bands, which also introduce transmission nulls in their out-of-band regions, and combined to create a diplexer without the need for junction compensation elements. However, this implementation would be expected to be physically large although functional.

Therefore, small BPFs were designed as a shunt stub along a transmission line, with an additional open stub for tuning. Based on a dual-band BPF response with this approach, the two BPFs are combined without any compensation elements.

The center frequencies are chosen as a trade-off between branch PA performances. Two intermediate frequencies $f'_1$ and $f'_2$ correspond to the inside edges of frequency bands $B_1$ and $B_2$ of the diplexer (FIG. 1) and the branch PAs. The lower-band PA and $|S_{21}|$ of the diplexer provide amplification from $f_1$ to $f'_1$, while the upper-band PA and diplexer $|S_{31}|$ operate from $f'_2$ to $f_2$. The fractional bandwidths $FBW_1$ and $FBW_2$ of the branch PAs are therefore easily defined, and for the transition band $B_{tr}$ between them, the $FBW_{tr}$ of $f'_1$ to $f'_2$ can be expressed as:

$$FBW_{tr} = 2\frac{f_2\frac{2-FBW_2}{2+FBW_2} - f_1\frac{2+FBW_1}{2-FBW_1}}{f_2\frac{2-FBW_2}{2+FBW_2} + f_1\frac{2+FBW_1}{2-FBW_1}}. \quad \text{(Eqn. 4)}$$

Therefore, for $FBW_{tr}=0$ and $FBW_1=FBW_2=FBW$, the greatest FBW a branch PA needs to achieve is:

$$FBW = 2\frac{(\sqrt{f_2} - \sqrt{f_1})^2}{f_2 - f_1}. \quad \text{(Eqn. 5)}$$

Though a real diplexer must have a non-zero $B_{tr}$, equation 5 gives a target bandwidth for each branch PA, to maintain reasonable performance in the transition band. For example, if a total octave bandwidth is desired, each PA can have FBW 34.3%, assuming $B_{tr}=0$. It is typically desired to have a low-order filter for less sensitivity at the filter edges, smaller size, and limited loss.

Finally, from a layout point of view, it is simplest to design the splitting/combining ports of the diplexer to be aligned for later combination with the PAs.

We note that the diplexer filters need not be designed for 50Ω-only impedance at their amplifier connections, they may instead be designed to interface directly with impedance of the transistor terminals.

B. Individual PA Design

Initially, the high and low band PAs are designed separately at the lower and upper bands, while also targeting minimal performance degradation in the transition band. While the design will function with both amplifiers being class-A amplifiers, or with both amplifiers being class AB amplifiers, in an embodiment both transistors are class-B biased to improve power efficiency. In alternative embodiments, both amplifiers are biased as Class C amplifiers, and in yet other alternative embodiments, both amplifiers are Class E, F, or J amplifiers. With class A or AB biasing, if a single narrowband signal is present in either the lower or upper bands, overall efficiency is degraded by simultaneous current draw from both transistors; while with class-B or C biasing current draw occurs in the amplifier coupled to amplify the band of the narrowband signal and not in the amplifier coupled to amplify the other band. Additionally, the diplexer nulls help reduce current draw due to RF leakage between the two paths.

In some embodiments, such as that of FIG. 5B, both the PAs are single-ended amplifiers. In alternative embodiments, both of the PAs are push-pull amplifiers such as linear class AB or B push-pull amplifiers. In additional alternative embodiments, both of the PAs are balanced amplifiers.

To further optimize power consumed in the PAs, in some embodiments the PAs are Doherty amplifiers. In some supply-modulated embodiments, power voltage supplied to each PA is modulated according to signal amplitude in the band that amplifier is coupled to amplify, some supply-modulated amplifiers are known as class H amplifiers; in supply-modulated embodiments receiving a strong low-band signal and weak or absent high-band signal, the low-band PA may receive higher power supply voltage than the high-band PA, and when receiving a strong high-band signal and weak or absent low-band signal, the high-band PA may receive higher power supply voltage than the low-band PA.

Once the three frequency regions are chosen and a diplexer is designed, little adjustment is needed in the diplexer. However, the process of determining the frequency regions is technology-dependent and can be iterative, using considerations from Bose-Fano considerations as a starting point.

A primary consideration in the initial design is in-band performance, while maximizing output power in the transition band is a secondary target. However, it is not necessary to obtain the best performance in the transition band initially, since it will change once the full circuit is completed.

C. Component Integration

To derive the power gain to port 1 from port 2 of a three-port network with load $\Gamma_i$ at port i, the average power delivered to port 2 of the network and power delivered to the port-1 load must be found. To begin, the port-2 input power is:

$$P_{in,2} = \frac{|V_S|^2}{8Z_0} \frac{|1-\Gamma_2|^2}{|1-\Gamma_2\Gamma_{in,2}|^2}(1-|\Gamma_{in,2}|^2), \quad \text{(Eqn. 6)}$$

where the input impedance $\Gamma_{in,2}$ can be determined.

Solving next for $V_1^-$ from the three equations defining the scattering parameters yields:

$$V_1^- = V_2^+ \frac{S_{12}+A\Gamma_3}{1-S_{11}\Gamma_1+B\Gamma_3}, \quad \text{(7a)}$$

$$A = S_{13}S_{32} - S_{12}S_{33}, \quad \text{(7b)}$$

$$B = -S_{33} + \Gamma_1(S_{11}S_{33} - S_{13}S_{31}), \quad \text{(7c)}$$

$$V_2^+ = \frac{V_S}{2} \frac{1-\Gamma_2}{1-\Gamma_2\Gamma_{in,2}}. \quad \text{(7d)}$$

Equations (7a-7d) can be inserted into the equation for power delivered to port 1, $$P_{L,1} = \frac{|V_1^-|^2}{2Z_0}(1-|\Gamma_1|^2), \quad \text{(eqn. 8)}$$

resulting in an expression for the power gain between ports 2 and 1:

$$G_{P,12} = \frac{P_{L,1}}{P_{in,2}} = \frac{1-|\Gamma_1|^2}{1-|\Gamma_{in,2}|^2} \frac{|S_{12}+A\Gamma_3|^2}{|1-S_{11}\Gamma_1+B\Gamma_3|^2}. \quad \text{(eqn. 9)}$$

Consider two PAs, with attributes $P_{out,n}$, $P_{in,n}$, and $P_{DC,n}$ for n=[1, 2], connected to the combining ports two and three of an output diplexer. Let $\Gamma_1=0$ to represent the system load, and let $\Gamma_2$ and $\Gamma_3$ represent the output impedances of the PAs. Therefore:

$$G_{P,12} = \frac{|S_{12}+\Gamma_3(S_{13}S_{32}-S_{12}S_{33})|^2}{(1-|\Gamma_{in,2}|^2)|1-S_{33}\Gamma_3|^2}, \quad \text{(eqn. 10, 11)}$$

$$\Gamma_{in,2} = S_{22} + \frac{S_{23}S_{32}\Gamma_3}{1-S_{33}\Gamma_3}.$$

and similarly, for $G_{P,13}$. The overall output power is:

$$P'_{out} = P_{out,1}G_{P,12} + P_{out,2}G_{P,13} \quad \text{(eqn. 12)}$$

Similarly, the PAs can be connected at the input with an input diplexer at ports two and three, resulting in an overall input power of:

$$P'_{in} = \frac{P_{in,1}}{G_{P,21}} = \frac{P_{in,2}}{G_{P,31}}, \quad \text{(eqn. 13)}$$

noting that, in a particular embodiment, $G_{P,ij}=G_{P,ji}$ because both diplexers are identical and reciprocal. Transducer gain is not used in this case because it is nearly identical to power gain, as the input of the diplexer should be well-matched over both frequency bands and the $\Gamma_{in,1}$ terms of the equivalent form of equation 9 for the input diplexer is close to zero.

The dc component of the drain current $I_{D,n}$ of a PA can be modelled as a function of the input power:

$$I_{D,n} = f_n(P_{in,n}) \quad \text{(eqn. 14)}$$

Assuming that functions $f_n$ for the PAs are known, equations 13 and 14 can be used to determine the drain current $I'_{D,1}$ within the full circuit as:

$$I'_{D,1} = f_1(P'_{in} \cdot G_{P,21}), \quad \text{(eqn. 15)}$$

and similarly, for $I'_{D,2}$. Therefore, with in an embodiment having common drain voltage supply $V_{DD}$, the overall PAE can now be defined as:

$$PAE = 100 \frac{P'_{out}-P'_{in}}{V_{DD}(I'_{D,1}+I'_{D,2})}[\%], \quad \text{(eqn. 16)}$$

which is valid for all frequency bands of the full PA. Depending on the out-of-band performance of $G_P$, significant additional drain current could be drawn, lowering PAE.

To demonstrate the effect of proper insertion loss and biasing with a single CW signal in the lower band, assume $G_{P,12}=G_{P,13}=|S_{21}|^2=|S_{31}|^2=0.9$ (0.9 dB insertion loss), $P_{out,1}=10$ W, $P_{out,2}=0$ W, $P_{in,1}=1$ W, $P_{in,2}=0$ W, and $P_{DC,1}=18$ W, so that the one branch PA has 50% PAE and 10 dB gain. For a 28 V shared drain bias, equation 16 becomes:

$$PAE = 100 \frac{7.89}{18+28I_{drain,2}}[\%]. \quad \text{(eqn. 17)}$$

Starting with a 50% baseline PAE, the full PA has an overall gain of 9.1 dB and 43.8% PAE if class-B biased with perfect diplexer isolation. If biased in class-AB with 100 mA drain current, the overall PAE degrades further to 37.9%. With no insertion loss and only 10 mA current draw, the gain remains 10 dB but PAE degrades to 49.2%. Qualitatively, this suggests that insertion loss is most relevant, while proper biasing and diplexer nulls still play an important role in maintaining PAE.

With an ideal diplexer, considering just the lower band, $S_{13}=S_{31}=0$. Therefore, equation 10 can be simplified to:

$$G_{P,12} = \frac{|S_{12}|^2}{1-|\Gamma_{in,2}|^2}. \qquad (\text{eqn. 18})$$

Furthermore, an ideal diplexer also has $S_{22}=0$ and $S_{23}=0$ in the lower band, resulting in $|\Gamma_{in,2}|^2=0$. This leads to $G_P=|S_{12}|^2$. Similarly, in the upper band, $G_P=|S_{13}|^2$, and so the assumptions previously made hold true, regardless of the output impedance of either PA. However, in the transition band, $G_P$ is affected by the output impedance of each PA.

Therefore, by ensuring the output match of each PA is low, insertion loss can be minimized. For a flat overall output power over the lower or upper band, the individual PAs in some embodiments have a corresponding flat output power. However, in the transition band, there is additional flexibility. Considering equation 12 as a function over frequency, to maintain a flat response over all frequency bands, its derivative must be zero:

$$\frac{\partial P'_{out}}{\partial f} = P_{out,1}\frac{\partial G_{P,12}}{\partial f} + \qquad (\text{eqn. 19})$$
$$\frac{\partial P_{out,1}}{\partial f}G_{P,12} + P_{out,2}\frac{\partial G_{P,13}}{\partial f} + \frac{\partial P_{out,2}}{\partial f}G_{P,13} = 0.$$

If both PAs have equal and flat output powers in the transition band, in addition to their respective bands, equation 19 becomes:

$$\frac{\partial G_{P,12}}{\partial f} = -\frac{\partial G_{P,13}}{\partial f}, \qquad (20)$$

which is true for a symmetric diplexer. However, this difficult PA requirement is not necessary because $G_{Pin}$ in equation 10 is a function of the output impedance of each PA. Therefore, that output impedance can be used as a tuning variable in equation 19 to maintain flat output power in the transition band without requiring a flat individual PA response.

IV. Diplexed PA Design

The design of a 1.8-4 GHz hybrid implementation of the diplexed approach is detailed for completeness, adding the relationship to the theory presented above. A center frequency of 2.9 GHz is chosen for this design with the goal of maximizing bandwidth. The 7 W Qorvo T2G-6000528-Q3 gallium nitride (GaN) packaged transistor, which operates from dc to 6 GHz, is selected with Pout=38 dBm. The transistor is mounted on an aluminum heat-sink and the PCB is fabricated on a 0.762 mm thick Rogers 4350B substrate, with the final PA shown in FIG. 5A.

The PA of FIG. 5A is illustrated in the schematic diagram of FIG. 5B. Resistors are designated R and shown with standard symbols, as are capacitors designated C. Boxes designated TL are transmission line portions, which in the embodiment of FIG. 5A are microstrip transmission line segments. In the particular embodiment of FIGS. 5A and 5B, RF input 505 couples through the diplexer high BPF 507 and low BPF 509, each BPF having a shorted stub and an open stub. High-band BPF 507 feeds high-band amplifier 501, and low BPF 509 feeds low-band amplifier 503. The high band amplifier 501 feeds an output diplexer high-band BPF 511, and low-band amplifier 503 feeds low-band BPF 513 of the output diplexer. Transistors 515, 517 of the high band and low band amplifiers are biased to operate in class-B by bias circuitry 519, and power is supplied by power supply circuitry 521. High-band BPF 511 and low-band BPF 513 feed an overall amplifier output 523.

For the design of the input and output diplexer divider/combiner, BPFs are first designed with center frequencies of 2.1 and 3.6 GHz, found as geometric means between band edges and the center frequency. As the theory in Section III.A indicates, shunt short and open stubs are used for filtering and tuning, respectively. Combined, these form an initial diplexer design, where the open stub is tuned to maintain low reflection and combining loss across f1=1.6 GHz to f2=4.3 GHz. The following procedure is used for the full PA design:

A. Design the two branch PAs with around 30% fractional bandwidths. In the implemented circuit, the lower-band PA covers f1=1.8 GHz to f'1=2.8 GHz of B1, while the upper-band PA covers f'2=2.8 GHz to f2=4 GHz of B2. The matching networks are designed as stepped-impedance lines for the load-pulled impedances, and harmonics terminated approximately in an open impedance to improve efficiency. The transistors are biased near pinch-off in class-B at 0.1% of Imax, where Vgate=−3 V, with an associated minimal (0.3 percentage point) reduction in power-added efficiency (PAE) due to the other transistor's current draw.

B. Perform the diplexer layout so that the two combining ports are aligned and spaced appropriately to fit the PAs.

C. Adjust the PA designs to account for the layout of the diplexer. Modelithics models are used for each of the lumped and active components. The transistor is simulated with a 0.17 nH source inductance and 0.8 source resistance to account for mounting parasitics. Perform the layout of the PAs including full-wave electromagnetic (EM) simulations.

D. Perform full-wave simulations of the final diplexer.

E. Perform full-wave simulations and tuning of the final matching networks.

Figure 6:
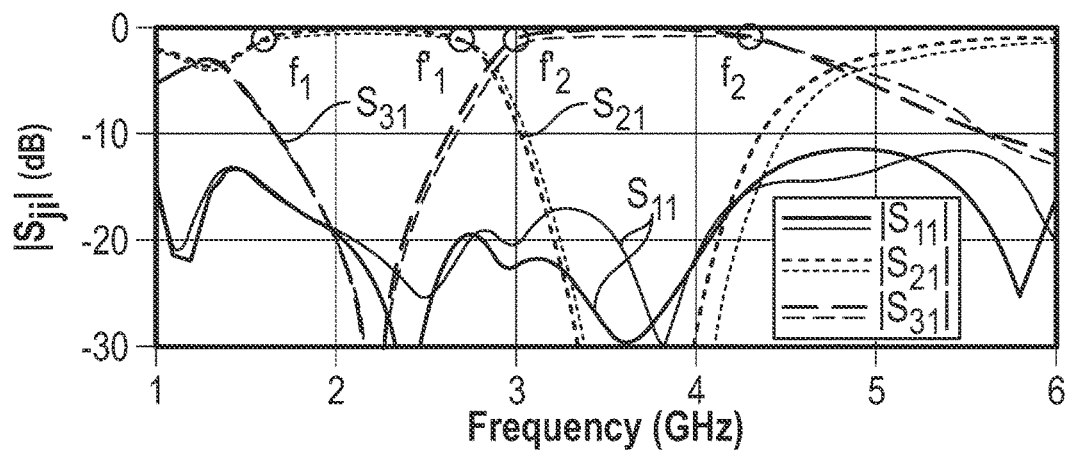
FIG. 6 is a graph showing simulated (solid) and measured (dotted) parameters of an exemplary microstrip diplexer of the prototype amplifier of FIG. 5.

The final diplexer for the exemplary prototype in FIG. 5 has |S21| covers f1=1.6 GHz to f'1=2.7 GHz of B1, while |S31| covers f'2=3 GHz to f2=4.3 GHz of B2. The passive sub-circuit portion of the exemplary prototype in FIG. 5 was measured separately and the results are plotted in FIG. 6. The diplexer maintains a measured low insertion loss and good match from 1.6-4.3 GHz. The transition band of the diplexer is between f'1=2.7 GHz and f'2=3 GHz, defined where the insertion loss is 1 dB above the minimum loss in each band.

Figure 7:
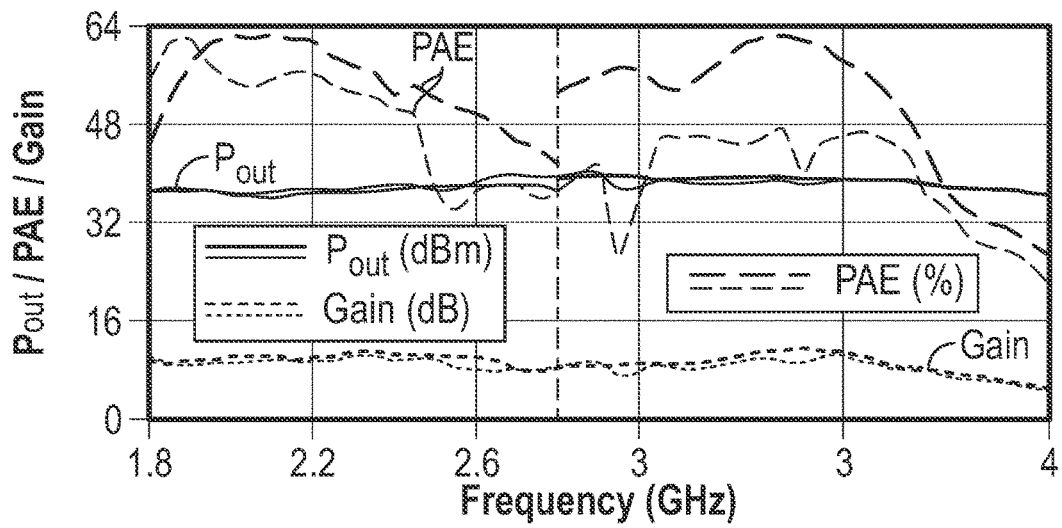
FIG. 7 is a graph showing simulated (solid) and measured (dotted) gain of an exemplary prototype amplifier of FIG. 5.
Figure 8:
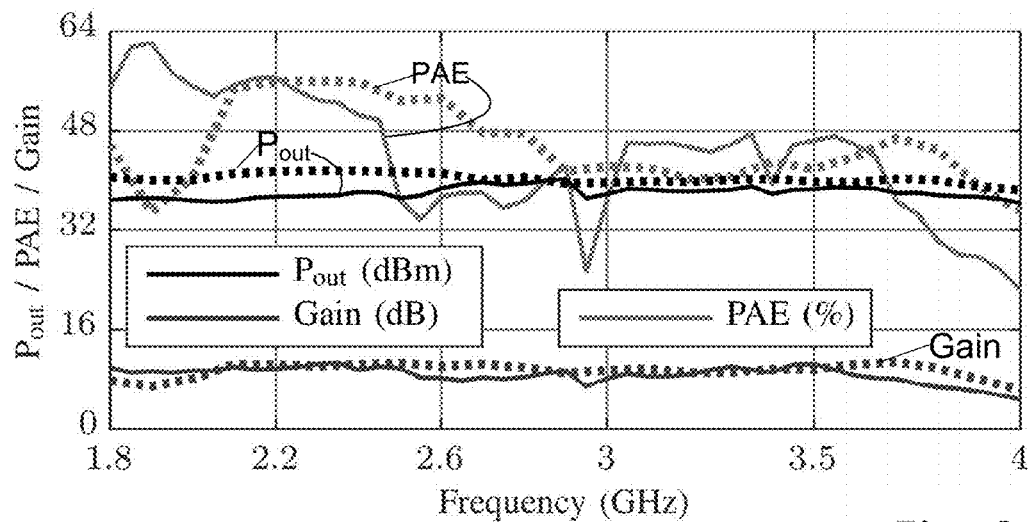
FIG. 8 is a graph illustrating simulated and measured gain, efficiency, and power output versus frequency of the prototype amplifier of FIG. 5.

Measured large-signal gain, power out, and efficiency of individual amplifiers are illustrated in FIG. 7, and the full, combined, diplexed PA, in FIG. 8 with solid lines representing calculated and dotted lines indicating measured results for non-concurrent signals The gate bias had to be reduced to −3.3 V/2.3 mA from the nominal −3 V/7.2 mA predicted by the nonlinear model, to exhibit a class-B gain. The two PAs maintain an average measured PAE, over their respective bands, of 55.3/49.4% with an average output power and gain of 37.2/38.5 dBm and 10.0/8.9 dB, respectively.

As expected, the maximum output power of the full circuit is slightly less than that of the branch PAs due to the combining loss of the diplexer. This loss also contributes to the degradation in PAE. The measured PAE of the full PA, averaged over the band, is 43.7% and the corresponding average output power and gain are 38 dBm and 8.8 dB, respectively. Because each branch PA has PAE maximized within its corresponding band, there is a degradation in out-of-band performance, contributing to the lesser efficiency between B1 and B2. The relationship between the contiguous diplexers and branch PAs is chosen to maintain constant gain and output power across the band. An alternative trade-off design is with the branch PAs more efficient in the transition region with flat PAE, at the expense of maximal efficiency, as suggested by the Bode-Fano criterion discussion in Section II.

V. CW and IMD Performance

This section compares the non-concurrent and concurrent CW large-signal performance of a "standard" broadband amplifier described in *Efficient multisignal 2-4-GHz power amplifier with power tracking*, by M. R. Duffy, et al., IEEE Transactions on Microwave Theory and Techniques, vol. 66, no. 12, pp. 5652-5663, 2018; and the diplexed amplifier herein described.

A. Non-Concurrent Mode Comparison

Figure 9:
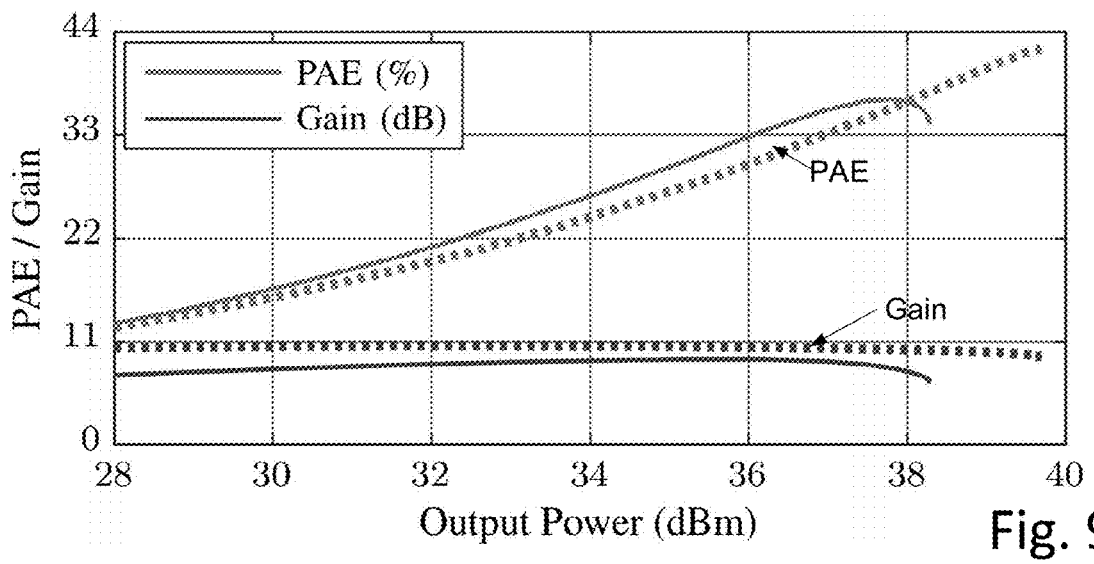
FIG. 9 is a graph illustrating simulated and measured efficiency and gain versus input drive to the prototype amplifier of FIG. 5.

In the non-concurrent CW mode, each test is conducted with a single CW tone input. FIG. 8 plots the gain, output power, and PAE of both PAs over 1.8-4 GHz. As expected, both maintain relatively flat output power and gain. The drive-up performance at the 3 GHz transition band is shown in FIG. 9 of the exemplary prototype diplexed amplifier in solid lines and compared to the "standard" PA in dashed lines. As expected, the diplexed architecture saturates earlier in the transition band. Note that the "standard" PA for this comparison uses a Cree device rated at a slightly higher power than the Qorvo device.

B. Concurrent Mode Comparison

Figure 10:
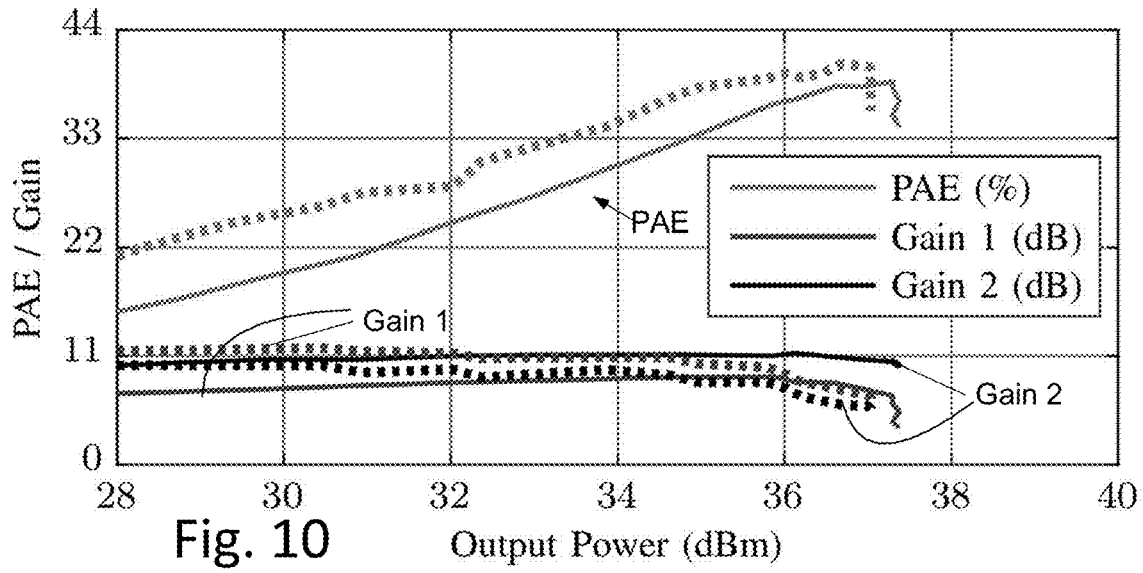
FIG. 10 is a graph illustrating simulated and measured efficiency and gains versus input drive into the prototype amplifier of FIG. 5 for gains of 2.5 and 3.5 GHz tones.
Figure 11A:
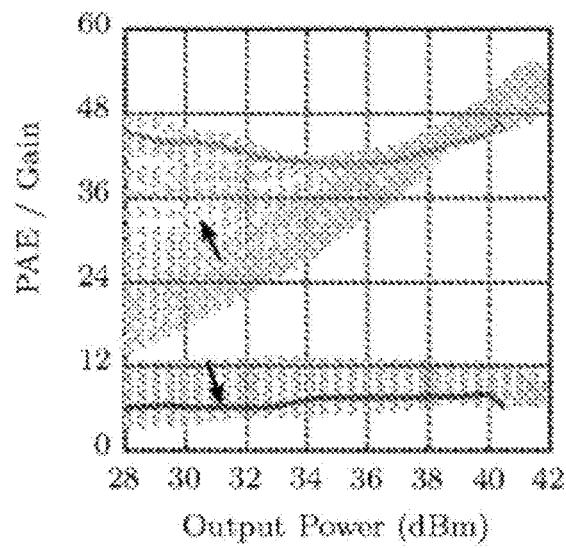
FIGS. 11A, 11B, 11C, and 11D are graphs illustrating measured concurrent drive-up performance of "standard" (FIGS. 11A and 11C) and diplexed broadband (FIGS. 11B and 11D) power amplifiers, both class-B biased. The top row (FIGS. 11A and 11B) sweeps 2.5 GHz output power with a fixed 3.5 GHZ Pcross value, while the bottom row (FIGS. 11C and 11D) sweeps 3.5 GHz output power for a fixed 2.5 GHz Pcross. Solid lines correspond to the saturated concurrent performance of Table II, with faded dashed lines corresponding to lower and higher output power conditions, with an arrow pointing in the direction of increasing Pcross.
Figure 11B:
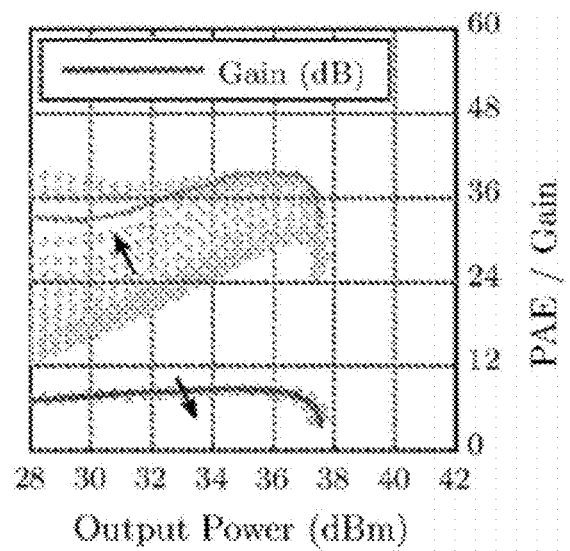
Figure 11C:
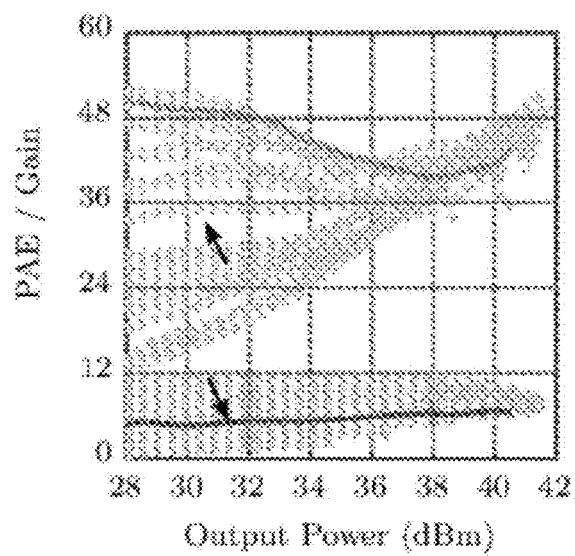
Figure 11D:
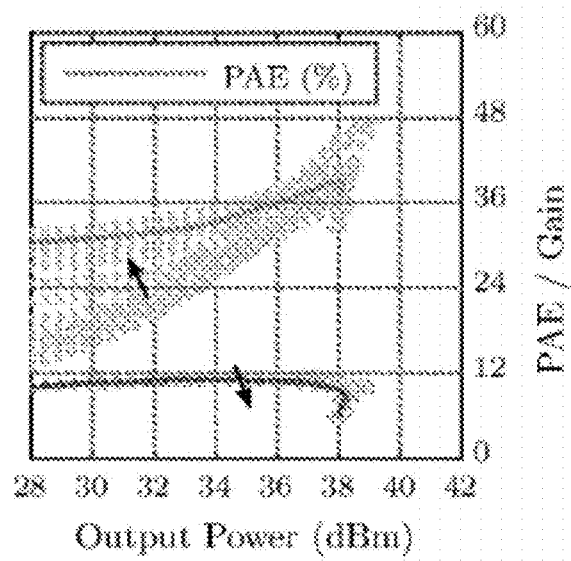

In the concurrent CW mode, each test is conducted with two simultaneous tone inputs at 2.5 and 3.5 GHz for the "standard" broadband PA and the diplexed PA to obtain two-dimensional drive-up curves. In this case, in addition to the harmonic content, intermodulation (IMD) products are present. For equal output power values at 2.5 and 3.5 GHz, FIG. 10 plots the PAE and gains, where the two gain curves correspond to individual gains of the 2.5 and 3.5 GHz tones. The diplexed PA saturates later than the "standard" PA in this case.

The locations of the maximum concurrent PAE points for the two PAs are summarized in Table II, with similar performance. Note that the diplexed architecture achieves more output power (40.3 dBm) in the concurrent than in the non-concurrent mode, due to the power combining of two PAs.

In addition, its total gain (8.4 dB) is greater than that of the "standard" PA (6.8 dB).

Fixing the output power, $P_{cross}$ at one (cross) frequency, corresponding to Table II the concurrent drive-up curves of the other (self) frequency can be obtained. This, alongside other concurrent power conditions, are depicted in FIG. 11 in solid and faded lines, respectively. In general, the PAE increases and gain decreases as $P_{cross}$ is increased (direction of arrow). However, the gain variation and maximum output power degradation are much less in the diplexed PA than in the "standard" one.

The entire two-dimensional drive-up curves of the output spectrum are considered in context of IMD products. The relative power of each IMD product is calculated by:

$$\Delta P_{IMD} = P_{fund,max} - P_{IMD,max} \qquad \text{(eqn. 21)}$$

where $P_{fund,max}$ is the maximum of the greater of the two fundamental tones, and $P_{IMD,max}$ is the maximum power of each IMD product occurring for any power. The highest values are summarized in Table III, demonstrating that the diplexed architecture contains significantly less IMD power than the "standard" architecture. The values shown in bold in the table correspond to common IMD products for the two PAs.

In general, the IMD power increases as $P_{cross}$ is increased (direction of arrow), but with about 20 dB less power in the diplexed PA than in the "standard" one. This can be explained as follows. In the "standard" architecture, maximum concurrent output power is limited by additional IMD content, which in turn lowers the fundamental power. Appropriate matching could mitigate this problem, but this approach requires accurate nonlinear models, which often are not available or validated for this purpose. In the diplexed architecture, on the other hand, there are effectively no IMD products, but output power is limited by combining loss.

Harmonics are not considered in Table III even though they have higher powers than the IMD products.

TABLE II

SUMMARY OF MAXIMUM CONCURRENT PAE LOCATIONS

| PA | Gain$_1$ (dB) | Gain$_2$ (dB) | $P_{out, 1, 2}$ (dBm) | PAE (%) |
|---|---|---|---|---|
| "Standard" | 7.6 | 6.1 | 36.7 | 40.5 |
| Diplexed | 7.0 | 10.4 | 37.3 | 38.8 |

TABLE III

COMPARISON OF LARGEST IMD PRODUCTS

| "Standard" | | Diplexed | |
|---|---|---|---|
| $\Delta P_{IMD}$ (dBc) | IMD (GHz) | $\Delta P_{IMD}$ (dBc) | IMD (GHz) |
| −11.6 | 2f$_1$ − f$_2$ = 1.5 | −22.6 | 2f$_2$ − f$_1$ = 4.5 |
| −13.4 | f$_2$ − f$_1$ = 1.0 | −27.3 | 2(f$_2$ − f$_1$) = 2.0 |
| −14.7 | 2f$_2$ − f$_1$= 4.5 | −27.5 | 2f$_1$ − f$_2$ = 1.5 |
| −20.2 | f$_1$ + f$_2$ = 6.0 | −27.8 | f$_2$ − f$_1$ = 1.0 |
| −20.9 | 2(f$_2$ − f$_1$) = 2.0 | −28.8 | 2f$_1$ + f$_2$ = 8.5 |

VI. Performance with Modulated Signals

Spectral regrowth in any amplifier exhibiting non-linearity (FIG. 9) affects transmitted signal characteristics. Concurrent modulated signals introduce additional distortion due to the IMD content, which the diplexed architecture aims to reduce with analog RF circuitry. In addition, DPD can be used in baseband to further reduce signal distortion with a 1-D memory polynomial model.

When a single-ended broadband PA amplifies concurrent signals, cross-modulation distortion can be corrected using a more complicated 2-D memory polynomial model. The digital complexity of the 2-D model scales as $N \times N = N^2$, making the 2-D model less attractive and more difficult to implement. The broadband diplexed PA architecture inherently separates concurrent signals with diplexers, and so the 2-D model cannot be used. However, the requirements on the DPD complexity are reduced from $N^2$ to $2N$ by modelling the two branches with 1-D models, making practical implementations simpler.

A 5G-like signal is generated in MATLAB, consisting of a 5 MHz bandwidth, 20 frames, 30 kHz sub-carrier spacing, 132 sub-carriers, 256 FFT length, oversampling rate of 7, and a cyclic prefix length of 18. A random bitstream is modulated onto 64 quadrature-amplitude-modulated (QAM) symbols to generate this OFDM signal, which is low-pass digitally filtered. Two such uncorrelated signals are upconverted to 2.5 and 3.5 GHz carriers with two triggered VSTs (NI PXIe-5645, 80 MHz and NI PXIe-5646, 200 MHz), sampled at 53.76 Ms/sec.

After a circulator in each path, the outputs of the VSTs are combined and amplified by a broadband linear instrumentation driver amplifier (MiniCircuits ZHL-16W-43). The input path is calibrated to the output of the driver, where the device under test (DUT) is attached. The output path is power calibrated from the DUT, through an attenuator and coupler to a spectrum analyzer, followed by a splitter to the downconverters in the VSTs.

To linearize the diplexed PA, a 1-D memory polynomial is found with a similar 5G-like test signal consisting of 10 frames. The chosen memory polynomial has a memory length of 3 and non-linearity order of 6 for all measurements to give the lowest adjacent-channel power ratio (ACPR) values. The original 20-frame 5G-like signals are digitally pre-distorted using the measured memory polynomial to produce new gain dispersion and frequency spectra output in FIG. 14. These results demonstrate a lower/upper ACPR improvement with DPD at 2.5 GHz from −23.4/−24.2 to −34.5/−34.0 dB and an EVM improvement from 17.7 to 3.7%. At 3.5 GHz, there is a lower/upper ACPR improvement from −28.0/−28.2 to −34.2/−34.3 dB and an EVM improvement from 9.7 to 3.6%.

The BER is zero with DPD in both cases.

PA performance in the transition region is confirmed with a similar non-concurrent modulated 5G-like signal centered at 3 GHz. Gain dispersion and frequency spectra of the corresponding output is shown in FIG. 15.

VII. Discussion and Conclusion

In summary, an analysis of a diplexing architecture for broadband PA design is presented. By diplexing concurrent signals into two paths consisting of relatively narrowband but efficient PAs, overall efficiency, gain, power, and linearity remain high. Linearity of concurrent signals is improved further with a simple implementation of DPD. The advantages of this architecture become clear when comparing concurrent signal IMD products with a more "standard" broadband PA.

Another factor contributing to performance degradation is the load presented by the diplexer to each PA in the transition band. Even if each PA had a well-matched output impedance, the diplexer load always equals at least |S22|.

In band, this is not an issue because the value is low, but this value necessarily increases in the transition band, resulting in degraded branch PA performance. This could be improved with a tunable network, or with signal correction, but is not considered here. Stability, however, is ensured over a wide range of port terminations.

Group delay is important in certain applications, including applications where signals occur in an overlap frequency region near the high-frequency cutoff frequency of the low-band diplexer BPFs and the low-frequency cutoff frequency of the high-band diplexer BPFs where the overall amplifier output has significant contributions from both the low-band and high-band PAs. It is desirable to avoid situations where group delay of the low-band diplexers and PA mismatches group delay of the high-band diplexers and PA sufficiently that the low-band contribution to the broadband amplifier output is significantly out of phase with, and partially cancels, the high-band contribution to the broadband amplifier output. Group delay can also be compensated for by adding an additional delay-compensating filter on one side of each diplexer.

Filters, such as the BPFs of the diplexers, tend to have increased group delay around pass-band edges. The output impedance was tuned to maintain a flat output power response, and for fixed PA output matching networks, it may be possible to tune the input impedance of the PA to maintain an appropriate input match while also flattening and equalizing the group delay for both paths.

In alternative embodiments, group delay of high and low band circuitry may be matched by adding a short transmission line of appropriate impedance and length to the side having shorter group delay.

Finally, steps (A) and (B) of the design process, for branch PAs, may be combined with an updated diplexer design. Rather than designing the two combined/split ports to 50 ohms impedance, one may instead design them to the complex source and load-pull impedances of the device, reducing footprint.

If more than two branches are desired, additional care should be taken in the multiplexer design, as insertion loss tends to increase with the number of branches.

When bandpass filters are used in the diplexers, these filters help reduce harmonics generated by each branch PA as they are combined into the broadband amplifier output. For example, consider an amplifier where the low band frequency range extends from F1 to F2, and the high band frequency range extends from F2 to F3. If F2 is less than 2 times F1, the second harmonic of any low band signal is greater than F2 and is reduced by the low band filter of the diplexer. Similarly, if F3 is less than 2 times F2, the high band filter of the diplexer reduces harmonics of any high band signal being amplified. This gives less harmonic distortion than with a single wideband amplifier because if F3 is greater than 2 times F1 and a single wideband amplifier used, some of these harmonics would be retained in unreduced form. In embodiments, F1 and F2 are chosen, and the output diplexer's low-band filter configured, such that second and third harmonics of signals amplified by the low band PA are attenuated by the output diplexer's low-band filter.

The diplexed or multiplexed broadband amplifier herein described is useful with multiple concurrent signals, Further, since harmonics of each signal are reduced by diplexer filters before the high and low band signals are combined to give the overall wideband amplifier output, some intermodulation products, such as a beat frequency between a second harmonic of a low band signal and a concurrent high band signal, that may occur in a single-amplifier wideband PA are also reduced because the filters of the diplexers provide some isolation between the low band PA and high band PA. Further the diplexed or multiplexed amplifier herein disclosed also permits design of each branch PA to be focused on linearity rather than broad bandwidth, further reducing harmonics and intermodulation products.

For example, a system required to amplify signals of frequency greater than F2/2 and less than F2*2, where F2 is the high cutoff frequency of the low band diplexer filter, and F2 is also the low cutoff frequency of the high band diplexer filter, can take full advantage of harmonic reduction introduced by the diplexer filters.

The foregoing description of the invention has been presented for purposes of illustration and description and is not intended to be exhaustive or to limit the invention to the precise form disclosed, and obviously many modifications and variations are possible considering the above teaching. The embodiments were chosen and described to best explain the principles of the invention and its practical application, and to thereby enable others skilled in the art to best utilize the invention in various embodiments and with various modifications as are suited to the particular use contemplated. It is intended that the scope of the invention be defined by the claims appended hereto.

What is claimed is:

1. A wideband amplifier configured to receive a broadband input signal and provide an amplified broadband output signal comprising:
    a first multiplexer coupled to receive the broadband input signal and to divide the broadband input signal by frequency into a first-band input-signal and a second-band input-signal, the first-band input-signal having a lower frequency band than the second-band input-signal;
    a first band amplifier coupled to amplify the first-band input-signal and provide a first band output signal;
    a second band amplifier coupled to amplify the second-band input-signal and provide a second band output signal; and
    a second multiplexer coupled to combine the first band output signal and the second band output signal into the amplified broadband output signal;
    wherein: (i) a frequency range of the first-band input-signal overlaps a frequency range of the second-band input-signal in a transition region; and (ii) a frequency range of the first band amplifier overlaps a frequency range of the second band amplifier in the transition region;
    wherein, for frequencies in the transition region, a first signal path through the first multiplexer, the first band amplifier, and the second multiplexer has a first group delay matching a second group delay of a second signal path through the first multiplexer, the second band amplifier, and the second multiplexer; and
    the second multiplexer is configured to sum the first band output signal with the second band output signal to provide gain in the transition region.

2. The wideband amplifier of claim 1 wherein each of the first band amplifier and the second band amplifier is selected from a group consisting of class A amplifiers, class AB amplifiers, class B amplifiers, Class D amplifiers, Class E amplifiers, Class F amplifiers, Class H amplifiers, Class J amplifiers, Class AB push-pull, Class B push-pull, Doherty amplifiers, supply modulated amplifiers, and class C amplifiers.

3. The wideband amplifier of claim 1 wherein the first multiplexer and the second multiplexer are passive.

4. The wideband amplifier of claim 1 wherein each of the first multiplexer-and the second multiplexer is a diplexer.

5. The wideband amplifier of claim 1 wherein input impedances and output impedances of each of the first multiplexer and the second multiplexer are about 50 ohms, across all frequency bands of interest.

6. The wideband amplifier of claim 1 where the first multiplexer has an input impedance of about 50 ohms and an output impedance other than 50 ohms across all frequency bands of interest.

7. The wideband amplifier of claim 6 where the first band and second band amplifiers have an input impedance other than 50 ohms.

8. The wideband amplifier of claim 1 wherein the second multiplexer includes one of a bandpass filter and a lowpass filter that rejects harmonics generated in the first band and second band amplifiers.

9. The wideband amplifier of claim 1 wherein the second multiplexer is configured to prevent formation of intermodulation products from a first signal in the first-band input-signal mixing with a second signal in the second-band input-signal.

10. The wideband amplifier of claim 1, the first multiplexer being configured to further divide the broadband input signal by frequency into an additional band input signal; and further comprising:
    an additional band amplifier coupled to amplify the additional band input signal to provide at an additional band output signal;
    the second multiplexer further combining the additional band output signal with the first and second band output signals into the amplified broadband output signal; and
    wherein a frequency range of the additional band input signal overlaps with one of (i) the frequency range of the first-band input-signal and (ii) the frequency range of the second band input signal.

11. The wideband amplifier of claim 1, wherein each band amplifier has a narrower sub-band frequency of operation than the wideband amplifier.

12. The wideband amplifier of claim 1, wherein the first multiplexer multiplexes the broadband signal independently with minimized insertion loss in the first band and second band frequency ranges, and minimized combining loss in the transition region frequency range, having high first band rejection in the second band and high second band rejection in the first band frequency ranges.

13. The wideband amplifier of claim 12 wherein each multiplexer comprises at least a low-pass filter and a high-pass filter.

14. The wideband amplifier of claim 12 where each multiplexer comprises-at least a first-band bandpass filter and a second-band bandpass filter.

15. The wideband amplifier of claim 14, wherein the high-frequency three-decibel cutoff frequency of the first-band bandpass filter of the first multiplexer is equal to the low-frequency three decibel cutoff frequency of the second-band bandpass filter of the first multiplexer.

16. The wideband amplifier of claim 15 wherein the first-band bandpass filter of the first multiplexer comprises a shorted segment of transmission line and an open segment of transmission line.

17. The wideband amplifier of claim 15 wherein the first-band bandpass filter of the first multiplexer comprises a Butterworth filter.

18. The wideband amplifier of claim 1, wherein each band amplifier has an output impedance adjusted for a flat output power response over an entire wideband frequency range of the wideband amplifier.

19. The wideband amplifier of claim 1 where the first band and second band amplifiers have an output impedance other than 50 ohms.

20. The wideband amplifier of claim 1 where the second multiplexer has an output impedance of close to 50 ohms and an input impedance other than 50 ohms across all frequency bands of interest.

21. The wideband amplifier of claim 1, further comprising a delay-compensating filter in one of the first signal path and the second signal path.

22. The wideband amplifier of claim 1, further comprising, in one of the first signal path and the second signal path, a transmission line that equalizes group delay in the first signal path and the second signal path.

* * * * *